US007351523B2

(12) United States Patent
Grzeskowiak et al.

(10) Patent No.: US 7,351,523 B2
(45) Date of Patent: Apr. 1, 2008

(54) PHOTOGRAPHIC MATERIALS HAVING IMPROVED KEEPING PROPERTIES

(75) Inventors: Nicholas E. Grzeskowiak, Hertford (GB); Colin J. Gray, Wealdstone (GB)

(73) Assignee: Eastman Kodak Company, Rochester, NY (US)

( * ) Notice: Subject to any disclaimer, the term of this patent is extended or adjusted under 35 U.S.C. 154(b) by 96 days.

(21) Appl. No.: 10/596,190

(22) PCT Filed: Nov. 14, 2004

(86) PCT No.: PCT/GB2004/004771

§ 371 (c)(1),
(2), (4) Date: Jun. 2, 2006

(87) PCT Pub. No.: WO2005/054945

PCT Pub. Date: Jun. 16, 2005

(65) Prior Publication Data

US 2007/0099131 A1    May 3, 2007

(30) Foreign Application Priority Data

Dec. 4, 2003    (GB)   ................... 0328128.4

(51) Int. Cl.
*G03C 1/46*    (2006.01)
(52) U.S. Cl. .................. 430/502; 430/604; 430/605; 430/570; 430/577; 430/394; 430/396; 430/311; 430/270.1
(58) Field of Classification Search ............ 430/604, 430/605, 570, 577, 502, 311, 394, 396, 270.1
See application file for complete search history.

(56) References Cited

U.S. PATENT DOCUMENTS 4,933,272 A    6/1990    McDugle et al.
6,200,739 B1    3/2001    Yamazaki

FOREIGN PATENT DOCUMENTS

GB    2 282 232    3/1995
WO    WO 92/16876    10/1992

*Primary Examiner*—Geraldina Visconti
(74) *Attorney, Agent, or Firm*—Andrew J. Anderson

(57) ABSTRACT

The use of a red-sensitising trinuclear merocyanine dye and an osmium dopant according to formula (I): $[Os(NZ)L_5]^r$ wherein Z is sulphur or oxygen, L is a ligand and r is 0, −1, −2 or −3, in photographic silver halide emulsions for use in photographic materials, result in a reduction and/or prevention of speed gain in the emulsion over time without significant speed loss.

21 Claims, No Drawings

PHOTOGRAPHIC MATERIALS HAVING IMPROVED KEEPING PROPERTIES

FIELD OF THE INVENTION

The present invention relates to photographic silver halide materials having good keeping properties (including raw stock stability) and particularly to materials sensitive to red light, especially high contrast films suitable for use in the graphic arts field or in the manufacture of printed circuit boards. More particularly, the invention is concerned with photographic silver halide emulsions having certain osmium dopant materials in combination with certain trinuclear merocyanine dyes having a reduced speed gain over time to provide more stable and predictable photographic materials, and to a method of preparing the same.

BACKGROUND OF THE INVENTION

High contrast silver halide emulsions are widely used in photographic materials and are of particular benefit in the field of graphic arts and in the manufacture of printed circuit boards. In such fields of technology, a higher contrast film can provide improved definition and clarity.

Films used in graphic arts commonly utilise emulsions comprising a mixture of silver chloride and silver bromide and are typically doped with a low level of rhodium (III) complexes, which enhances contrast by setting an exposure threshold, by permanently trapping photoelectrons produced by low levels of light exposure, above which a developable surface latent image may be formed.

Alternative dopants to the rhodium (III) complexes normally used are disclosed in U.S. Pat. No. 4,933,272, which is concerned with the internal incorporation of doping agents into silver halide grain lattices, including various iron, ruthenium, osmium, rhenium and iridium dopants.

WO-A-92/16876 discloses a method of increasing the contrast of photographic materials at low exposures, especially in photographic papers, by incorporating a dopant combination of an iridium dopant and among others an osmium dopant, including osmium nitrosyl pentachloride dopants.

GB-A-2282232 discloses a method of increasing the raw stock stability of red-sensitised photographic silver halide materials suitable for use, for example, in graphic arts films. The method involved incorporating in the silver halide emulsions red sensitising dyes of the trinuclear merocyanine type, the higher the concentration of which was incorporated the better the stability. The emulsions were also doped, as usual, preferably with rhodium, but optionally with ruthenium, osmium, iridium or other group VIII metals.

One problem that arises in photographic materials that contain high contrast emulsions, particularly those employing red sensitising dyes, is that over a period of time the traps provided by the rhodium (III) dopant materials can slowly become filled as a result of electrons from spurious sources and as a consequence, the speed of the emulsion tends to increase and the contrast tends to decrease. This problem is of particular relevance to graphic arts films where high contrast emulsions are utilised that contain relatively high concentrations of red sensitising dyes (because most of the laser diodes in use in the field are red light sources), which in the absence of light slowly inject electrons into the emulsion grains. Accordingly, nominally identical films of different age may have speed variability and contrast may decrease and image quality be reduced after prolonged storage.

PROBLEM TO BE SOLVED BY THE INVENTION

It is desirable to improve the keeping of graphic arts films and other silver halide photographic materials by reducing the extent of or preventing speed gain over time, whilst maintaining the desired level of contrast and image quality.

SUMMARY OF THE INVENTION

According to a first aspect of the invention, there is provided a photographic silver halide emulsion for use in photographic materials, said silver halide emulsion comprising a red-sensitising trinuclear merocyanine dye and an osmium dopant according to formula I

$$[Os(NZ)L_5]^r \quad (I)$$

wherein Z is sulphur or oxygen,

L is a ligand r is 0, −1, −2, −3.

In a second aspect of the invention, there is provided a photographic material comprising a silver halide emulsion as defined above.

In a third aspect of the invention, there is provided a method of manufacturing a photographic material, said method comprising coating a silver halide emulsion as defined above onto a photographic support.

In a fourth aspect of the invention, there is provided a method of manufacturing a printed circuit board, the method comprising exposing an electronic circuit layout pattern onto a film for use in the preparation of a printed circuit board, developing the exposed photographic material to produce a photomask, placing the photomask in contact with a printed circuit board substrate, exposing the printed circuit board substrate through the mask and processing the exposed printed circuit board substrate.

In a fifth aspect of the invention, there is provided a method for reducing the extent of or preventing speed gain over time of a photographic silver halide emulsion sensitive to red light, said method comprising incorporating into the silver halide emulsion a trinuclear merocyanine dye and an osmium dopant as defined above.

In a sixth aspect of the invention, there is provided a use of an osmium dopant as defined above in combination with a red sensitising trinuclear merocyanine dye to minimise speed change over time of a silver halide emulsion.

In a seventh aspect of the invention, there is provided a use of an osmium dopant as defined above and an iridium dopant in combination with a red-sensitising trinuclear merocyanine dye to reduce the extent of or prevent speed gain over time in a silver halide emulsion whilst maintaining a desired level of contrast.

ADVANTAGEOUS EFFECT OF THE INVENTION

The use of a combination of an osmium complex bearing an NO or NS ligand, especially $Os(NO)Cl_5$, as a dopant material and a red-sensitising trinuclear merocyanine dye in a photographic silver halide emulsion reduces and/or prevents speed gain in the emulsion over time. Where the silver halide emulsion is also doped with an iridium complex, such as $[IrCl_6]^{2-}$, the extent of speed gain over time is reduced whilst maintaining a desired level of contrast.

DETAILED DESCRIPTION OF THE INVENTION

The osmium complexes that may be utilised in the present invention fall within the general formula I $$[Os(NZ)L_5]^r \quad (I)$$

wherein, Z is sulfur or oxygen, L is a ligand and r is 0, −1, −2 or −3.

The five ligands, L, in the osmium complex may be five ligands the same, or may be different. They may be any convenient choice of ligand, and may include additional nitrosyl or thionitrosyl ligands. Examples of preferred ligands, L, other than nitrosyl or thionitrosyl, include halide ligands, specifically fluoride, chloride, bromide and iodide, cyanide ligands, cyanate ligands, thiocyanate ligands, selenocyanate ligands, tellurocyanate ligands and azide ligands. Nitrosyl or thionitrosyl may account for one of the ligands, L, but preferably the five ligands, L, are halide and/or cyanide ligands, more preferably halide ligands and most preferably chloride ligands. The NZ group is preferably a nitrosyl group.

The complex may be associated with a suitable counter ion such as, for example, caesium or potassium, preferably caesium. The most preferred complex for use in the present invention is $Cs_2Os(NO)Cl_5$.

The osmium dopant may be incorporated into the silver halide emulsion in an amount sufficient to enables the benefits of the present invention to be demonstrated. Preferably, the osmium dopant is incorporated into the silver halide emulsion in an amount of $10^{-10}$ to $10^{-5}$ moles per mole equivalent of silver, more preferably $10^{-9}$ to $10^{-6}$ moles per mole equivalent silver and most preferably $5 \times 10^{-8}$ to $1 \times 10^{-6}$ moles per mole equivalent of silver.

With regard to high contrast silver halide emulsions suitable for use in the graphic arts and in manufacturing printed circuit boards, for example, to which the present invention is particularly applicable, the silver halide emulsion is preferably a chlorobromide emulsion. Preferably, the silver halide emulsion comprises at least 50 mole % silver chloride, more preferably up to 90 mole % silver chloride, still more preferably 60-90 mole % silver chloride and most preferably 60-80 mole % silver chloride. The remainder of the silver halide is preferably substantially made up of silver bromide (optionally at least 20 mole % silver bromide) and more preferably comprises a small proportion (e.g. up to 1 or 2%) of silver iodide.

The silver halide emulsion is preferably sensitised to light of the wavelengths emitted by solid state diode red light sources commonly used in imagesetters and photoplotters. Preferably, the silver halide emulsion is sensitised to light in the range 600-690 nm.

In the red-sensitising trinuclear merocyanine dyes used according to the present invention, the nuclei generally used in merocyanine dyes can be used for the basic heterocyclic nuclei and may, for example, be selected from a pyrroline nucleus, an oxazoline nucleus, a thiazoline nucleus, a pyrrole nucleus, an oxazole nucleus, a thiazole nucleus, a selenazole nucleus, an imidazole nucleus, a tetrazole nucleus or a pyridine nucleus; a nucleus in which one of these nuclei is fused with an aliphatic hydrocarbyl ring, or a nucleus in which one of these nuclei is fused with an aromatic hydrocarbyl ring, for example, an indolenine nucleus, a benzindolenine nucleus, an indole nucleus, a benzoxazole nucleus; a naphthoxazole nucleus, a benzothiazole nucleus, a naphthothiazole nucleus, a benzoselenazole nucleus, a benzimidazole nucleus or a quinoline nucleus. These nuclei may be substituted on carbon atoms. Examples of red-sensitising trinuclear merocyanines dyes that may be utilised are those disclosed in U.S. Pat. No. 5,116,722 Preferably, trinuclear merocyanine dyes are utilised which dyes do not stain during processing, i.e. which washes out and does not leave colour on the film.

Preferred trinuclear merocyanine dyes are those according to formula II

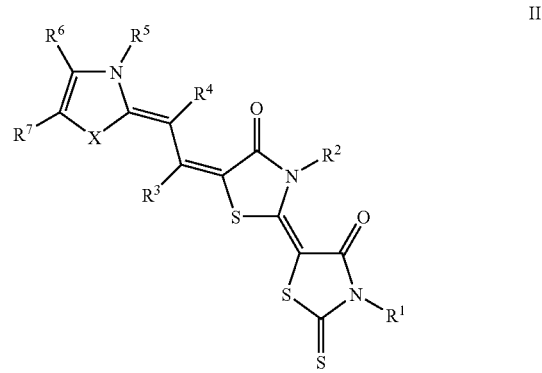

wherein

X is S or Se;

$R^1$, $R^2$, $R^3$, $R^4$ and $R^5$ are independently hydrogen, alkyl, substituted alkyl, alkenyl, substituted alkenyl, aryl, substituted aryl or an organic radical carrying a water solubilizing group and at least 2 members of $R^1$, $R^2$, $R^3$, $R^4$ and $R^5$, but not $R^3$ and $R^4$ together, are independently an organic radical carrying a water-solubilizing group;

$R^6$ and $R^7$ each independently represent hydrogen, hydroxy, a halogen, an alkyl group, a substituted alkyl group, an alkenyl group, a substituted alkenyl group, an alkoxy group, a substituted alkoxy group, an alkylthio group, a substituted alkylthio group, an arylthio group, a substituted arylthio group, an aryl group, a substituted aryl group, an acyl group, a substituted acyl group, an acyloxy group; a substituted acyloxy group, an alkoxycarbonyl group, a substituted alkoxycarbonyl group, an alkylsulphonyl group, a substituted alkylsulphonyl group, a carbamoyl group, a substituted carbamoyl group, a sulphamoyl group, or $R^6$ and $R^7$ together represent the atoms necessary to complete an annellated carbocyclic ring system, which may bear one or more substituents, which may be the same or different and are chosen from the above substituents which $R^6$ and $R^7$ may independently represent.

By water-solubilizing group, it is meant a group that, where at least two representatives of that group being the same or different are present in the dye molecule, renders the dye sufficiently soluble in water that during development and fixing of the photo-exposed silver halide emulsion, it is largely removed from the material. A sufficient solubility in water is obtained, for example, when at least 0.5 g of dye dissolves in 1 liter of water at room temperature at pH greater than 7. The water-solubilizing group may be present in the form of its free acid, its salt or in latent form. When in latent form, a sufficient solubility is obtained during the alkaline processing.

The number of water-solubilizing groups is preferably 2 or 3. The organic radical carrying a water-solubilizing group may be, for example, an alkyl radical such as methyl or ethyl, carrying a water-solubilizing group in free acid form, in salt form or in latent form. Examples of an organic radical carrying a water-solubilizing group include —$(CH_2)_n$—COOM, $C_6H_4$—COOM, —$CH_2$—$C_6H_4$—COOM, —(C $H_2)_n$—$SO_3M$, $C_6H_4$—$SO_3M$, —$CH_2$—$C_6H_4$—$SO_3M$, —$CH_2$—COO—$CH_2$—COO—$R^8$, —$CH_2$—COO—$CH_2$—CO—$R^8$, wherein n is a positive integer from 1 to 4, M is hydrogen, ammonium, an alkali metal atom selected from, for example, sodium, potassium and lithium, or an organic amine salt such as, for example, a triethylamine salt, an ethyldiisopropylamine salt, a pyridine salt and a diazabicyclo-undecane salt, and $R^8$ is an alkyl group such as methyl.

Examples of organic radicals carrying a water-solubilizing group in its latent form includes, for example, —$CH_2$—COO—$CH_2$—COO—$CH_3$ and —$CH_2$—COO—$CH_2$—CO—$CH_3$.

Preferably, $R^1$ to $R^5$ are independently selected from hydrogen, an alkyl group such as methyl, ethyl, n-propyl, isopropyl, n-butyl, s-butyl or t-butyl, or an organic radical carrying a water solubilizing group.

More preferably $R^1$ and $R^2$ are each independently an organic radical carrying a water-solubilizing group; $R^3$ is an alkyl group or substituted alkyl group, such as methyl, ethyl, propyl or isopropyl, preferably ethyl, propyl or isopropyl; $R^4$ is hydrogen; and $R^5$ is an alkyl group or substituted alkyl group, such as methyl, ethyl, propyl or isopropyl, or an organic radical carrying a water-solubilizing group.

$R^6$ and $R^7$ preferably together represent the atoms necessary to complete an annellated carbocyclic ring system such as, for example, a benzene ring or a naphthalene ring system.

X is preferably S.

Preferably, trinuclear merocyanine dyes according to formulae III, IV and V are utilised, wherein the water solubilising groups may be present in their free acid form or as suitable salts, such as alkali metal salts, thereof.

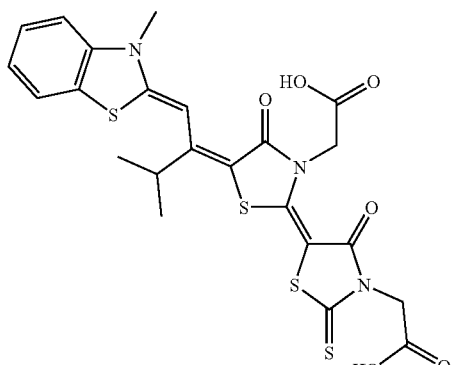

(III)

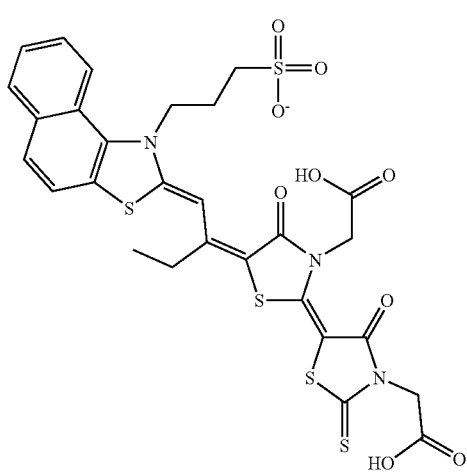

(IV)

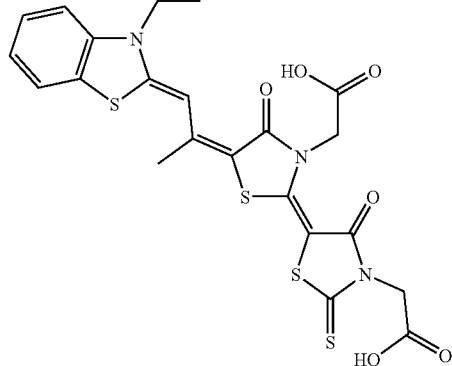

(V)

In a preferred embodiment of the invention, the red-sensitising trinuclear merocyanine dye is a compound according to formula II as defined above, wherein $R^3$ is an alkyl group or substituted alkyl group having 2 or more carbon atoms. Preferably, $R^3$ has 2-6 carbon atoms and is preferably an unsubstituted alkyl group. Most preferably, $R^3$ is an ethyl group, propyl group or an isopropyl group.

Accordingly, it is most preferable that trinuclear merocyanine dyes according to formulae III or IV are utilised in the silver halide emulsions of the present invention.

The amount of sensitising dye used in the silver halide emulsion is preferably in the range of 50 to 1000 mg per mole equivalent of silver (mg/Agmol), more preferably 100 to 600 mg/Agmol and still more preferably 150 to 500 mg/Agmol. Optionally, depending upon the photographic utility intended for the silver halide emulsion (and the grain size), it is most preferable to incorporate the sensitising dye into the silver halide emulsion in an amount of from 300 to 500 mg/Agmol (for use in, for example, the manufacture of printed circuit boards) or from 150 to 350 mg/Agmol (for use in, for example, graphic arts film).

It has been found that the trinuclear merocyanine dyes according to formula II, especially those of formulae III and IV above, are particularly effective when used in combination with the osmium dopants of the invention, especially the osmium nitrosylpentachloride complexes, at providing silver halide emulsions which maintain the desired speed over time without significant speed gain or loss.

In another preferred embodiment of the present invention, the silver halide emulsion is also doped with an iridium dopant. The iridium may be added as a halide salt or an organic ligand complex, in the trivalent or tetravalent state. For example, the iridium may be added as iridium halides, alkali metal iridium halide, alkalkine earth metal iridium halide, e.g. iridium (III) chloride, iridium (IV) chloride, potassium hexachloroiridate (IV) and ammonium hexachloroiridate (III) or (IV). Preferably, the iridium is added as iridium (IV) chloride $IrCl_6^{2-}$ complex, as the potassium salt.

Other examples of iridium dopants that may be utilised according to the present embodiment include, for example, $[IrCl_5(thiazole)]^{2-}$, $[IrCl_4(thiazole)_2]^{1-}$, $[IrBr_5(thiazole)]^{2-}$, $[IrBr_4(thiazole)_2]^{1-}$, $[IrCl_5(5\text{-methylthiazole})]^{2-}$, $[IrCl_4(5\text{-methylthiazole})_2]^{1-}$, $[IrCl_5(5\text{-methylthiazole})]^{2-}$, $[IrBr_4(5\text{-methylthiazole})_2]^{1-}$, $[IrCl_6]^{2-}$, $[IrCl_6]^{3-}$, $[IrBr_6]^{2-}$ and $[IrBr_6]^{1-}$.

It has been found that the combination of the osmium dopant and red-sensitising trinuclear merocyanine dyes of the present invention with an iridium dopant can provide the desired prevention of speed change over time whilst maintaining a desired level of contrast. Such combinations can provide emulsions that give red sensitive films having the speed and contrast required for graphic arts or printed circuit board films that do not undergo significant change in speed or loss of contrast over time. The preferred combination of osmium and iridium dopants is $Cs_2Os(NO)Cl_5$ and $K_2IrCl_6$.

The iridium dopant may be present in the emulsion in an amount relative to the osmium sufficient to give the desired contrast and sensitivity. Preferably, the iridium dopant is present in the silver halide emulsion in an amount of $10^{-10}$ to $10^{-5}$ moles per mole equivalent of silver, more preferably $10^{-9}$ to $10^{-6}$ moles per mole equivalent silver and most preferably $5\times10^{-8}$ to $1\times10^{-6}$ moles per mole equivalent of silver.

The osmium and/or the iridium dopant may be incorporated throughout the silver halide grains of the silver halide emulsion or in specific locations or layers, for example the osmium and or the iridium dopant may each independently be located throughout, in the core of or in the outer region of the grain. Where both dopants are utilised, they may both be incorporated throughout the grain or they may be incorporated in different parts, for example in mixed or separate layers. In one embodiment where both osmium and iridium dopants are utilised, the osmium dopant may be incorporated in a core region of the silver halide grain, for example, the first 25%, and the iridium dopant may be incorporated in the outer region of the grain.

The emulsions employed in the photographic materials described herein, and the addenda added thereto, the binders, supports, etc., may be as described in Research Disclosure Item 36544, September 1994, published by Kenneth Mason Publications, Emsworth Hants, PO10 7DQ, UK.

The hydrophilic colloid may be gelatin or a gelatin derivative, polyvinylpyrrolidone or casein and may contain a polymer. Suitable hydrophilic colloids and vinyl polymers and copolymers are described in Section IX of the Research Disclosure. Gelatin is the preferred hydrophilic colloid.

The silver halide emulsion may be coated onto any transparent support suitable for use in graphic arts, such as an Estar® polyethylenetetraphthalate support.

The photographic materials may also contain an overcoat hydrophilic colloid layer, which may also contain a vinyl polymer or copolymer located as the last layer of the coating (furthest from the support). It contains one or more surfactants to aid coatability and may also contain some form of matting agent. The vinyl polymer is preferably an acrylic polymer and preferably contains units derived from one or more alkyl or substituted alkyl acrylates or methacrylates, alkyl or substituted acrylamides, or acrylates or acrylamides containing a sulfonic acid group.

The photographic materials described herein preferably include an antihalation layer that may be on either side of the support, preferably on the opposite side of the support from the emulsion layer. In a preferred embodiment, an antihalation dye is contained in the hydrophilic colloid underlayer. The dye may also be dissolved in or dispersed in the underlayer. Suitable dyes are listed in the Research Disclosure above.

The silver halide emulsions may be prepared by any common method of grain growth, preferably using a balanced double run of silver nitrate and salt solutions using a feedback system designed to maintain the silver ion concentration in the growth reactor. Dopants may be introduced uniformly from start to finish of precipitation or may be structured into regions or bands within the silver halide grains. Further dopants, for example other osmium dopants, ruthenium dopants, iron dopants rhenium dopants or iridium dopants, for example cyanoruthenate dopants, may be added. Such complexes may alternatively be utilised as grain surface modifiers in the manner described in U.S. Pat. No. 5,385,817. Chemical sensitisation may be carried out by any of the known methods, for example with thiosulphate or other labile sulphur compound, and with gold complexes. Preferably, the chemical sensitisation is carried out with thiosulphate and gold complexes.

After addition of the sensitising dye at a level to give the emulsion the desired sensitivity, antifoggants and stabilisers may be added as is known in the art. Antifoggants that may be useful in silver halide emulsions according to the present invention include, for example, azaindenes such as tetraazaindenes, tetrazoles, benzotriazoles, imidazoles and benzimidazoles. Specific antifoggants that may be used include 5-carboxy-2-methylthio-4-hydroxy-6-methyl-1,3,3a,7-tetraazaindene, 1-(3-acetamidophenyl)-5-mercaptotetrazole, 6-nitrobenzimidazole, 2-methylbenzimidazole and benzotriazole. Preferably, the extent to which tetraindazine stabilisers such as that of formula VII which is known to be used for enhancing keeping stability of rhodium doped emulsion (U.S. Pat. No. 6,444,392), are adsorbed to the surface of the silver halide grains in competition with the sensitising dyes is limited and preferably they are not added. Preferably, also, any stabilisers known to adsorb more strongly to the surface of the silver halide grains are used sparingly and preferably not used.

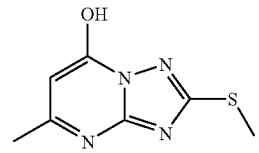

(VII)

In a preferred embodiment, the photographic materials according to the present invention are films for use in the graphic arts or in the preparation of printed circuit boards.

The film may be a high-contrast "hard dot" film (hard edges) or a "rapid access" film (softer dots, fuzzy edges).

The silver halide emulsion according to the present invention may therefore be used in nucleated or non-nucleated films, but are preferably used in nucleated films.

Nucleators and development boosters may be used to give ultra-high contrast, for example combinations of hydrazine nucleators such as those disclosed in U.S. Pat. No. 6,573,021. Booster compounds that may be present in the photographic material (or alternatively, in the developer solution used) include amine boosters that comprise at least one secondary or tertiary amino group and have an n-octanol/water partition coefficient (log P) of at least 1, preferably at least 3. Preferred boosters are bis-tertiary amines and bis-secondary amines, preferably comprising dipropylamino groups linked by a chain of hydroxypropyl units, such as those described in U.S. Pat. No. 6,573,021. Any nucleator or booster compound utilised may be incorporated into the silver halide emulsion, or alternatively may be present in a hydrophilic colloid layer, preferably adjacent the layer containing the silver halide emulsion for which the effects of the nucleator are intended. They may, however, be distributed between or among emulsion and hydrophilic colloid layers, such as undercoat layer, inter-layers and overcoat layers.

Photographic materials according to the present invention are particularly suitable for exposure by red or infra-red laser diodes, light emitting diodes or gas lasers, e.g. a helium/neon laser.

The light sensitive silver halide contained in the photographic material may be processed following exposure to form a visible image by associating the silver halide with an aqueous alkaline medium in the presence of a developing agent contained in the medium or in the material itself. The photographic material may be processed in conventional developers to obtain very high contrast images. When the material contains an incorporated developing agent, it can be processed in the presence of an activator, which may be identical to the developer in composition, but lacking a developing agent.

Very high contrast images can be obtained, for example, at pH values below 11, preferably in the range of from pH 10.0 to 10.8, preferably 10.3 to 10.5 and most preferably at about pH 10.4.

The developers are typically aqueous solutions, although organic solvents, such as diethylene glycol, can also be included to facilitate the solution of organic components. The developers contain one or a combination of conventional developing agents, such as for example, a polyhydroxybenzene such as dihydroxybenzene, aminophenol, a paraphenylenediamine, ascorbic acid eiythorbic acid and derivatives thereof, pyrazolidone, pyrazolone, pyrimidine, dithionite and hydroxylamine.

It is preferred to employ hydroquinone and 3-pyrazolidone developing agents in combination or an ascorbic acid-based system. An auxiliary developing agent exhibiting super-additive properties may also be used. The pH of the developers can be adjusted with alkali metal hydroxides and carbonates, borax and other basic salts. It is a particular advantage that the use of nucleators as described herein reduces the sensitivity of the photographic material to changes in this developer pH.

To reduce gelatin swelling during development, compounds such as sodium sulfate can be incorporated into the developer. Chelating and sequestering agents, such as ethylenediamine tetraacetic acid or its sodium salt, can be present. Generally any conventional developer can be used in the practice of this invention. Specific illustrative photographic developers are disclosed in the Handbook of Chemistry and Physics, 36th Edition, under the title "Photographic Formulae" at page 30001 et seq. and in "processing Chemicals and Formulas", 6th Edition, published by Eastman Kodak Company (1963).

Photographic materials according to the present invention may be utilized in the preparation of printed circuit boards. Typically a film material having a photosensitive silver halide emulsion according to the invention may be exposed with, for example, red light by photoplotter according to a desired electronic circuit layout. The film is then developed to form a phototool or photomask from which the printed circuit board can be made. The photomask may be positioned immediately adjacent to a printed circuit board substrate, usually a copper-clad, resist-covered printed circuit board substrate, on a contact-copying frame. Incident radiation such as UV light is provided by a source, typically within the contact frame, and is received by the photomask and transmitted directly to the photoresist layer through the minimum density regions on the film. The transmitted radiation causes a change in the properties of the photoresist e.g. a hardening such that areas exposed to the radiation are physically different from those that have been hidden by the mask layer. After exposure, the photoresist is processed to remove it from areas where it is desired to etch away the copper such that the resultant structure has regions of copper exposed and regions concealed by photoresist. The exposed areas of the copper are then etched. After etching, the remaining photoresist is removed from the printed circuit board to reveal the desired track pattern.

The beneficial effects of the invention will now be further illustrated without limitation by the following specific examples.

EXAMPLES

Example 1

An AgClBr emulsion of 70 mole % AgCl content, having grains of cubic habit and an edge length of 0.21 μm was made in a growth reactor containing aqueous ossein gelatin at 53° C. by the usual balanced double-run precipitation method, using two aqueous feedstock solutions, one containing 3M $AgNO_3$, and the second containing 2.1M NaCl and 0.9M NaBr, within which were dissolved both the dopants used (see below) prior to starting precipitation. The dopants were thereby introduced uniformly throughout the grains during precipitation.

Emulsion 1 was prepared containing $1.4 \times 10^{-7}$ moles of $Cs_2Os(NO)Cl_5$ and $2.0 \times 10^{-7}$ moles of $K_2IrCl_6$ per mole equivalent of silver (Ag mole).

Emulsion 2 was prepared in an identical manner to Emulsion 1, except that the dopants added were $3.3 \times 10^{-7}$ moles of $Na_2RhCl_5.H_2O$ and $2.0 \times 10^{-7}$ moles of $K_2IrCl_6$ per Ag mole.

After desalting by ultrafiltration, each of these emulsions was chemically sensitised by heating with 3.0 mg of $Na_2S_2O_3.5H_2O$ and 3.0 mg of $KAuCl_4$ per Ag mole.

Various coating solutions were prepared from Emulsions 1 and 2 as follows. To separate portions of chemically sensitised Emulsion 1, melted at 43° C. and pH 5.0, and after a preliminary addition of KI (0.3 g/Ag mole), were added the trinuclear merocyanine spectral sensitisers according to formulae III, IV & V and the sensitisers according to formulae VI & VIII, which are not trinuclear merocyanine dyes, at $3.37 \times 10^{-4}$ molar equivalents of dye per Ag mole (to be used in preparing coatings 1-1 to 1-5). Portions of Emulsion 2 were sensitised in an identical manner to those of Emulsion 1, except that trinuclear merocyanine dyes according to formulae III & IV were added to form coatings 2-6 & 2-7 respectively.

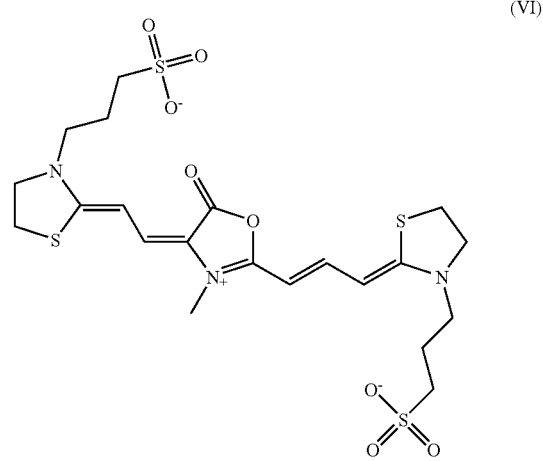

(VI)

-continued

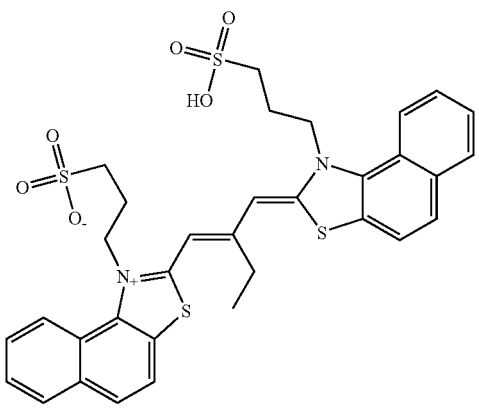
(VIII)

In all cases these dyes were allowed to adsorb to the grains for 20 minutes after which the stabiliser 5-carboxy-2-methylthio-4-hydroxy-6-methyl-1,3,3a,7-tetraazaindene (0.3 g/Ag mole) and antifoggant 1-(3-acetamidophenyl)-5-mercaptotetrazole (0.029 g/Ag mole) were added. The emulsion was then coated on an ESTAR® PET film support at a silver coverage of 3.15 g Ag/m² in a vehicle of 1.94 g/m² of total gelatin and 1.16 g/m² of latex copolymers of methyl acrylate, which also contained the nucleator of structure IX (0.013 g/m²), and surfactant, from a melt which was adjusted to a pH of 5.0 before coating. An underlayer containing a photographically inert red light absorbing solid particle dye (0.22 g/m²) in a vehicle of 1.0 g/m² gelatin and 1.0 g/m² of latex copolymers of methyl acrylate, and which also contained an amine booster of structure X (0.06 g/m2), was simultaneously coated between the emulsion layer and the support, and an overcoat of 1.5 g of gel containing hydroquinoine (0.16 g/m²), surfactants and lubricants simultaneously coated above the emulsion layer.

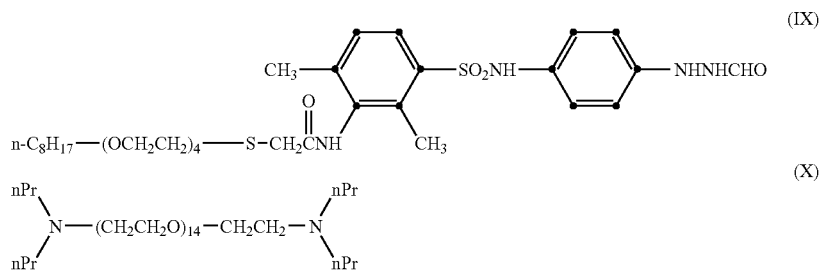

After 2 weeks keeping at room temperature and relative humidity the coatings were exposed to a series of increasing red light levels from a raster-scanned laser light source at 633 nm (HN), and then processed in a conventional hydroquinone-phenidone developer supplied by Eastman Kodak Company under the trade name ACCUMAX® Developer, processing for 45 seconds at 35° C., at 1+2 dilution with water. To simulate 1 year of shelf aging, further samples that had been incubated in foil sealed packets at 50° C. for 7 days, were exposed and processed identically to the fresh ones, at the same time.

TABLE 1

Fresh HN Sensitivity and Keeping Changes comparing Emulsions 1 & 2

| Coating | | Emulsion | Emulsion Contrast Dopant | Dye | Fresh sensitivity (rel log E) | 7 d 50° C. Change in sensitivity (log E) |
|---|---|---|---|---|---|---|
| 1-1 | Invention | 1 | Cs$_2$OsNOCl$_5$ | III | 0.78 | −0.015 |
| 1-2 | Invention | 1 | Cs$_2$OsNOCl$_5$ | IV | 0.71 | 0.00 |
| 1-3 | Invention | 1 | Cs$_2$OsNOCl$_5$ | V | 0.86 | −0.05 |
| 1-4 | Comparison | 1 | Cs$_2$OsNOCl$_5$ | VI | 0.70 | −0.065 |
| 1-5 | Comparison | 1 | Cs$_2$OsNOCl$_5$ | VIII | 0.39 | −0.08 |
| 2-6 | Comparison | 2 | Na$_2$RhCl$_5$•H$_2$O | III | 0.70 | +0.12 |
| 2-7 | Comparison | 2 | Na$_2$RhCl$_5$•H$_2$O | IV | 0.75 | +0.15 |

As can be seen from Table 1, the emulsions comprising trinuclear merocyanine dyes III & IV along with an osmium dopant (coatings 1-1 & 1-2) do not display an increase in speed (sensitivity) over time (simulated storage of 1 year), whereas the corresponding emulsions that comprise a rhodium dopant in place of the osmium dopant (coatings 2-6 & 2-7), whilst having a useful initial sensitivity undergo an unacceptably large increase in sensitivity on aging.

Of the coatings 1-1 to 1-5, coating 1-5, which uses dye VIII, which is not a trinuclear merocyanine dye, has a low initial sensitivity and undergoes a substantial loss in sensitivity over time. Coating 1-1 to 1-4 all have a useful level of sensitivity as fresh film, although coating 1-4, which uses dye VI (also not a trinuclear merocyanine dye) undergoes a relatively large loss in sensitivity over time as compared with emulsions 1-1 to 1-3, which use trinuclear merocyanine dyes III, IV & V respectively.

Coatings 1-1 and 1-2, which use dyes III & IV respectively, undergo no speed gain and no or an insignificantly small loss in sensitivity over time. These emulsions (1-1 & 1-2) provide the particular benefit of satisfactory repeatability if films of different age are used on an image setter or photoplotter device.

Example 2

Emulsion 3 was made by an identical method to that of Emulsion 1, except that the growth reactor temperature was lowered to 49° C., causing the grain size to be reduced to a mean edge length of 0.185 µm, and the dopant additions were increased to provide $2.0 \times 10^{-7}$ moles of Cs$_2$Os(NO)Cl$_5$ and $4.0 \times 10^{-7}$ moles of K$_2$IrCl$_6$ per Ag mole.

Emulsion 4 was made identically to Emulsion 3, except that the iridium co-dopant was entirely omitted.

Emulsion 5 was made identically to Emulsion 3, except that the dopants were $3.5\times10^{-7}$ moles of $Na_2RhCl_5\cdot H_2O$ and $5.0\times10^{-7}$ moles of $K_2IrCl_6$ per Ag mole.

These emulsions were each chemically sensitised by heating with 3.8 mg of $Na_2S_2O_3\cdot 0.5H_2O$ and 3.8 mg of $KAuCl_4$ per Ag mole.

Separate coatings of Emulsions 3 and 4, spectrally sensitised with Dye III, were made exactly following Examples 6 and 7 of U.S. Pat. No. 6,573,021, except that the 2-methylthio-4-hydroxy-6-methyl-1,3,3a,7-tetraazaindene component was omitted. The nucleator ratio of 3 mg/m² of Nuc I-6 and 5 mg/m² of Nuc. (M1/N1) as defined in that patent was used for both the present examples.

Evaluation of these coatings was made using the HN laser raster exposing device used in Example 1, and the films were processed with a development time of 30 seconds at 35° C. in a conventional hydroquinone-phenidone developer supplied by Eastman Kodak Company under the trade name PREMIER 7000®.

The speed and contrast data with Dye III in these nucleated GA films of emulsions doped with $Cs_2Os(NO)Cl_5$, with and without Ir co-dopant, compared to films of emulsions coated with Rh and Ir co-dopants, and changes (Δinc) in speed and contrast after 7 days incubation at 50° C. are presented in Table 2. The data described was obtained according to the method and measurements described in U.S. Pat. No. 6,573,021 and the various measurements, which are well known in the field, are defined therein.

TABLE 2

| Ctg. | Emulsion Dopants | Emulsion | Sp0.6 | Sp4 | Toe cont. | Upper scale cont. | ΔInc Sp0.6 | ΔInc Sp4 | ΔInc Toe cont. | ΔInc Upper scale cont. |
|---|---|---|---|---|---|---|---|---|---|---|
| 3-1 | $Cs_2Os(NO)Cl_5$ + $K_2IrCl_6$ | Em-3 Invention | 0.52 | 0.43 | 12.8 | 49.6 | −0.01 | −0.03 | −2.85 | −15.1 |
| 4-1 | $Cs_2Os(NO)Cl_5$ only | Em-4 Invention | 0.72 | 0.61 | 6.1 | 31.8 | 0.00 | −0.07 | −0.6 | −15.7 |
| 5-1 | $Na_2RhCl_5\cdot H_2O$ + $K_2IrCl_6$ | Em-5 Comparison | 0.61 | 0.52 | 11.9 | 44.0 | 0.21 | 0.12 | −5.9 | −27.0 |

As can be seen from Table 2, emulsions 3-1, 4-1 and 5-1 all have useful initial sensitivity. Both coatings 3-1 and 4-1, which have osmium containing emulsions, undergo no change or only small changes in speed and contrast compared to the rhodium comparison 5-1. Furthermore, the coating of 3-1, which has both the $Cs_2Os(NO)Cl_5$ dopant and the iridium co-dopant has a much higher initial contrast in both toe and shoulder regions of the D-log E curve than the coating 4-1 of emulsion containing only the $Cs_2Os(NO)Cl_5$ dopant.

The invention has been described in detail with particular reference to certain preferred embodiments thereof, but it will be understood that variations and modifications can be effected within the spirit and scope of the invention.

The invention claimed is:

1. A photographic material comprising a silver halide emulsion, said silver halide emulsion comprising a red sensitizing trinuclear merocyanine dye and an osmium dopant according to formula I $$[Os(NZ)L_5]^r \quad (I)$$

wherein

Z is sulfur or oxygen,

L is a ligand, and r is 0, −1, −2 or −3.

2. The photographic material of claim 1, wherein said osmium dopant is $[Os(NO)Cl_5]^{2-}$.

3. The photographic material of claim 1, wherein said red sensitizing dye sensitizes said silver halide emulsion to radiation in the range 600-690 nm.

4. The photographic material of claim 1, wherein said red sensitizing trinuclear merocyanine dye is a compound according to formula II

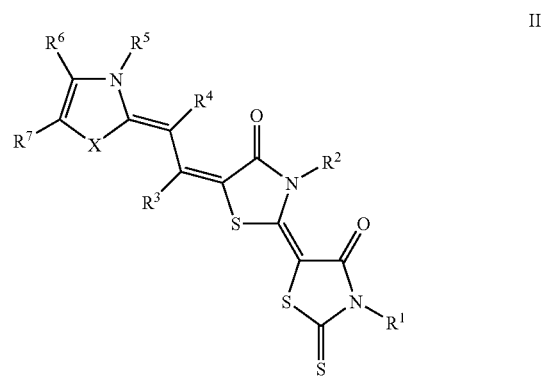

wherein

X is S or Se;

$R^1$, $R^2$, $R^3$, $R^4$ and $R^5$ are independently hydrogen or an unsubstituted or substituted alkyl, alkenyl, or aryl group, or an organic radical carrying a water solubilizing group and at least two members of $R^1$, $R^2$, $R^3$, $R^4$ and $R^5$, but not both $R^3$ and $R^4$, are independently an organic radical carrying a water-solubilizing group; and $R^6$ and $R^7$ each independently represent hydrogen, hydroxy, a halogen, an unsubstituted or substituted alkyl, alkenyl, alkoxy, alkylthio, arylthio, aryl, acyl, acyloxy, alkoxycarbonyl, alkylsulphonyl, or carbamoyl group, or a sulphamoyl group; or $R^6$ and $R^7$ together represent the atoms necessary to complete an annellated carbocyclic ring system, which may bear one or more substituents, which may be the same or different and are chosen from the above substituents which $R^6$ and $R^7$ may independently represent.

5. The photographic material of claim 4, wherein X is S, $R^1$ and $R^2$ are each independently an organic radical carrying a water-solubilizing group, $R^3$ is an unsubstituted or substituted alkyl group, $R^4$ is hydrogen, $R^5$ is an unsubstituted or substituted alkyl group or an organic radical carrying a water-solubilizing group and $R^6$ and $R^7$ together represent the atoms necessary to complete an annellated carbocyclic ring system.

6. The photographic material of claim 4, wherein said red sensitizing trinuclear merocyanine dye comprises a compound of formula III, IV or V

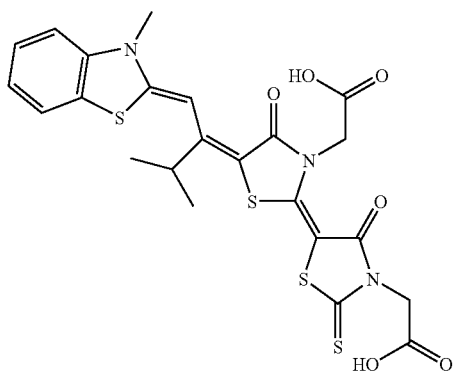
(III)

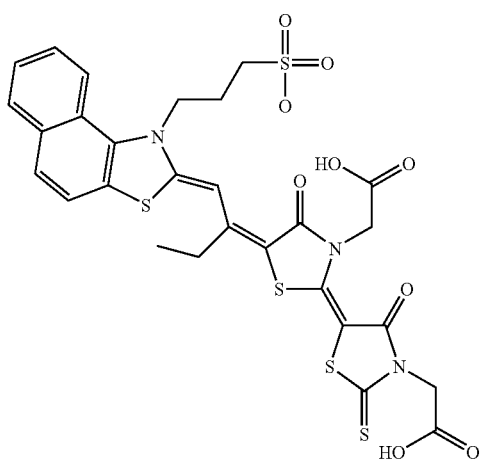
(IV)

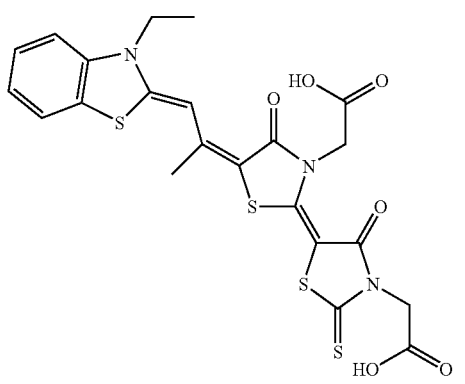
(V)

7. The photographic material of claim 4, wherein $R^3$ is an unsubstituted or substituted alkyl group having two or more carbon atoms.

8. The photographic material of claim 1, wherein said sensitizing dye is present in said silver halide emulsion in an amount of from 150 to 500 mg per mole equivalent of silver.

9. The photographic material of claim 1, wherein said osmium dopant is present in said silver halide emulsion in an amount of $5\times10^{-8}$ to $1\times10^{-6}$ moles per mole equivalent of silver.

10. The photographic material of claim 1, wherein said emulsion further comprises an iridium dopant.

11. The photographic material of claim 10, wherein said iridium dopant is $[IrCl_6]^{2-}$.

12. The photographic material of claim 10, wherein said iridium dopant is present in said silver halide emulsion in an amount of from $5\times10^{-8}$ to $1\times10^{-6}$ moles per mole equivalent of silver.

13. The photographic material of claim 1, wherein said emulsion comprises from 60 to 80 mole % silver chloride.

14. The photographic material of claim 1, which is a high contrast graphic arts film.

15. The photographic material of claim 1, which is a film for use in the preparation of a printed circuit board.

16. A method of manufacturing a printed circuit board, said method comprising image-wise exposing an electronic circuit layout pattern onto a photographic material comprising a silver halide emulsion, said silver halide emulsion comprising a red sensitizing trinuclear merocyanine dye and an osmium dopant according to formula I $$[Os(NZ)L_5]^r \quad (I)$$

wherein
Z is sulfur or oxygen,
L is a ligand, and
R is 0, −1, −2, or −3, developing said exposed photographic material to produce a photomask, placing said photomask in contact with a printed circuit board substrate, exposing said printed circuit board substrate through said mask and processing said exposed printed circuit board substrate.

17. A method for reducing the extent of or preventing speed gain over time of a red-sensitive photographic silver halide emulsion, said method comprising incorporating into said silver halide emulsion a trinuclear merocyanine dye and an osmium dopant according to formula I $$[Os(NZ)L_5]^r \quad (I)$$

wherein
Z is sulfur or oxygen,
L is a ligand, and
r is 0, −1, −2 or −3.

18. The method of claim 17, wherein said osmium dopant is $[Os(NO)Cl_5]$.

19. The method of claim 17, wherein said silver halide emulsion comprises a trinuclear merocyanine dye of formula II

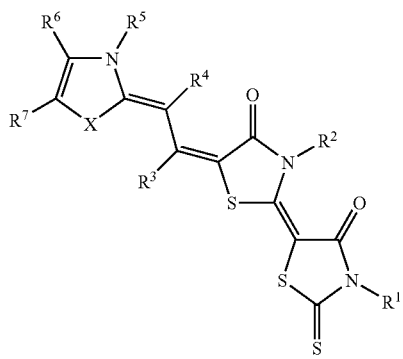
II wherein

X is S or Se;

$R^1$, $R^2$, $R^3$, $R^4$ and $R^5$ are independently hydrogen or an unsubstituted or substituted alkyl, alkenyl or aryl group, or an organic radical carrying a water solubilizing group and at least two members of $R^1$, $R^2$, $R^3$, $R^4$ and $R^5$, but not both $R^3$ and $R^4$, are independently an organic radical carrying a water-solubilizing group; and $R^6$ and $R^7$ each independently represent hydrogen, hydroxy, a halogen, an unsubstituted or substituted alkyl, alkenyl, alkoxy, alkylthio, arylthio, aryl, acyl, acyloxy, alkoxycarbonyl, alkylsulphonyl or carbamoyl group, or a sulphamoyl group; or $R^6$ and $R^7$ together represent the atoms necessary to complete an annellated carbocyclic ring system, which may bear one or more substituents, which may be the same or different and are chosen from the above substituents which $R^6$ and $R^7$ may independently represent.

20. The method of claim 17, which further comprises incorporating an iridium dopant into said silver halide emulsion.

21. The method of claim 20, wherein said iridium dopant is $[IrCl_6]^{2-}$.

* * * * *